United States Patent [19]

Song et al.

[11] Patent Number: 5,600,269

[45] Date of Patent: Feb. 4, 1997

[54] LOW POWER CONSUMPTION COMPARATOR CIRCUIT

[75] Inventors: Won-Chul Song; Chang-Jun Oh; Jong-Ryul Lee; Hae-Wook Choi, all of Daejeon, Rep. of Korea; Bang-Sup Song, Champaign, Ill.

[73] Assignee: Electronics and Telecommunications Research Institute, Daejeon, Rep. of Korea

[21] Appl. No.: 352,830

[22] Filed: Dec. 2, 1994

[30] Foreign Application Priority Data

Dec. 3, 1993 [KR] Rep. of Korea ............... 93-26314

[51] Int. Cl.⁶ ............................... H03F 3/45; G11C 7/00
[52] U.S. Cl. ......................... 327/52; 327/55; 327/57; 327/54
[58] Field of Search .................... 327/544, 546, 327/54, 55, 67, 72, 87, 89, 50, 57, 52, 562, 563

[56] References Cited

U.S. PATENT DOCUMENTS 4,973,864  11/1990  Nogami ............................... 327/55
5,263,001  11/1993  Youn et al. ........................... 365/227

FOREIGN PATENT DOCUMENTS

PCT/EP91/
   00920  12/1991  European Pat. Off. .

Primary Examiner—Timothy P. Callahan
Assistant Examiner—My-Trang Nu Ton
Attorney, Agent, or Firm—Larson and Taylor

[57] ABSTRACT

Disclosed is a low power-consumption type comparator circuit having two input terminals for receiving two input signals, one of which is an input reference signal and the other of which is an input comparison signal, and two output terminals, the circuit comprising signal converting portion for converting the input signals into current signals, respectively; switching portion for controlling transmission of the current signals to output terminals of the circuit in response to a latch signal indicating a latch operation or a normal operation of the circuit; high level holding portion for maintaining each voltage level of the output terminals to a logical high-state only when the latch operation of the circuit is not performed; amplifying/determining portion for amplifying the current signals and determining logical level of the input comparison signal; and output feedback portion for receiving output signals of the output terminals and enabling to make a current flowing in the circuit to a zero-state, only while the circuit is at the latch operation. Since a current-consumption is at a zero-state during the normal operation of the comparator circuit, the comparator circuit has a low power-consumption characteristic.

8 Claims, 16 Drawing Sheets

LOW POWER CONSUMPTION COMPARATOR CIRCUIT

BACKGROUND OF THE INVENTION

1. Field of the Invention

The present invention relates to a comparator circuit, more particularly to a low power-consumption type comparator circuit for an analog to digital converter (hereinafter, referred as to "A/D converter) possibly to be embodied in a small computer system, such as a portable computer, a note book type computer and the like.

2. Description of the Prior Art

FIG. 1 shows a typical one of prior art comparator circuits. In FIG. 1, the prior art comparator circuit is provided to compare two input signals CS1, CS2 applied from respective input terminals 11, 12 and comprises a pre-amplifying circuit portion 10, a control circuit portion 20, a signal transfer circuit portion 30 and a distinguishing circuit portion 40. One of the two input signals is an input comparison signal CS1 and the other is an input reference signal CS2.

In detail, the pre-amplifying circuit portion 10 is provided to receive and amplify the two input signals CS1, CS2 up to a predetermined voltage gain, and has first and second transistors Q11, Q12 which serve as a differential amplifier.

The control circuit portion 20 also is provided to control an amplifying operation of the pre-amplifying circuit portion 10 in accordance with an externally applied control signal VB1 through a first control terminal 21, and has a transistor Q21 in which a gate is connected to the first control terminal 21 and a drain and a source thereof are respectively connected to a common connection point of the differential amplifier Q11, Q12 and a first voltage source VSS.

The signal transfer circuit portion 30 is provided to transmit the two input signals amplified thus to the distinguishing circuit portion 40, and comprises four transistors Q31 to Q34 which are arranged in a folded cascode form having two cascade structures. One of the two cascade structures is connected between a second voltage source VDD and one of two output terminals OUT1, OUT2 and is constituted by two PMOS transistors Q31, Q32 which are connected in series with each other, and the other of the two cascade structures is connected between the second voltage source VDD and the other of the output terminal OUT1, OUT2 and is constituted by two PMOS transistors Q33, Q34 which are connected in series with each other. In the folded cascade structure, the transistors Q31, Q33 are commonly controlled by an externally applied control signal VB2 through a second control terminal 31, and the transistors Q32, Q34 are commonly controlled by an externally applied control signal VB3 through a third control terminal 32.

The distinguishing circuit portion 40 is provided to distinguish output signals of the output terminals OUT1, OUT2 in response to a latch signal LB applied through a latch terminal 41 as a compared output signal, and comprises three transistors Q41, Q42, Q43. In the distinguishing circuit portion 40 as shown in FIG. 1, drain and source of the transistors Q42 are respectively connected to the output terminal OUT1 and the first voltage source VSS, and drain and source of the transistor Q43 are respectively connected to the output terminals OUT2 and the first voltage source VSS. The transistor Q41 has a gate which receives the latch signal LB, drain and source are respectively connected to gates of the transistors Q42, Q43.

In the prior art comparator circuit as shown in FIG. 1, one of the two input signals CS1, CS2 indicates a reference signal, and the other of the two input signals indicates an objective signal to be compared with the reference signal. Also, between each of the output terminals OUT1, OUT2 and the first voltage source VSS, capacitors CL1, CL2 are respectively connected.

FIGS. 2A to 2D are timing diagrams showing the operation of the prior art comparator circuit of FIG. 1.

Since the comparator circuit of FIG. 1 has the pre-amplifying circuit 10 composed of the differential amplifier Q11, Q12, a current difference occurs between the drains of the first and second transistors Q11, Q12 in accordance with voltage levels of the input signals CS1, CS2. Then, since the same voltage is commonly applied to the gates of the transistors Q31, Q33 of the signal transfer circuit portion 30, the same current signal flows through each drains of the transistors Q31, Q33. Accordingly, a current signal I32 flows to the source of the transistor Q32 of the signal transfer circuit portion 30. This current signal I32 has an amount of current that equals the source current I31 of the transistor Q31 subtracted by a current I11 passing through the transistor Q11 of the differential amplifier.

Similarly, a current signal I34 flows to the source of the transistor Q34 of the signal transfer circuit portion 30. The current signal I34 has an amount of current that equals the source current I32 of the transistor Q33 subtracted by a current I12 passing through the transistor Q12 of the differential amplifier.

However, when a comparing operation is not performed in the comparator circuit, i.e. during a stand-by state, the latch signal LB as shown in FIG. 2A becomes a high level or logical "1". Then, the transistor Q41 of the distinguishing circuit portion 40 is made conductive, and therefore a potential difference between the output terminals OUT1, OUT2 becomes logical "0" regardless of the voltage level of each of the input signals CS1, CS2, as shown in a time interval T1, i.e. at the time of from t0 to t1 of FIG. 2C.

If a comparing operation is performed in the comparator circuit, the latch signal LB becomes a low level or logical "0", so that the transistor Q41 of the distinguishing circuit portion is not made conductive. Then, the current signals I32, I34 of the transistors Q32, Q34 are respectively applied directly to drains of the transistors Q42, Q43. The current signals I32, I34 are different in current amount due to a potential difference between the voltage levels of the input signals CS1, CS2, as shown in FIG. 2B. At the same time, a potential difference occurs between the output terminals OUT1, OUT2 owing to a current differential of the current signals I32, I34, as shown by a time interval T2 of FIG. 2C. In FIG. 2C, a dashed line indicates a voltage of the output terminal OUT1, and a solid line indicates a voltage of the output terminal OUT2.

In the prior art comparator circuit, because the transistors Q42, Q43 are connected in a positive feedback structure, either of the transistors Q42, Q43, where a relatively great amount of current is applied through a gate terminal thereof, is increased in conductivity to be made conductive, but the other thereof is rapidly decreased to be made not conductive.

For example, if an electric potential of the output terminal OUT1 is slightly higher than that of the output terminal OUT2, the conductivity of the transistor Q43 is increased more than that of the transistor Q42. As a result, an electric potential of the output terminal OUT2 is relatively lowered in comparison with that of the output terminal OUT1, and thus the transistor Q42 is rapidly made non-conductive.

Therefore, the distinguishing circuit portion 40 with the above-mentioned positive feedback structure can determine level of the objective signal quickly even if a voltage difference between the input signals CS1, CS2 is very slight.

In addition, the prior art comparator circuit is constant in current consumption over overall time interval, but the output voltage thereof is varied at a time t1, t2, t3 or t4 as shown in FIG. 2D. By variation of the output voltage, charging and discharging operations are performed in the capacitors CL1, CL2, and thus a slight current variation occurs instantaneously at the time t1, t2, t3 or t4, as shown in FIG. 2D.

FIG. 3 is a circuit diagram showing the construction of another prior art comparator circuit with a low power-consumption.

The comparator circuit of FIG. 3 comprises a signal converting circuit portion 50 constituted by two NMOS transistors Q51, Q52 for converting each voltage of input signals CS1, CS2 into current signals I51, I52, a switching circuit portion 60 constituted by two NMOS transistors Q61, Q62 for controlling transmission of the current signals to output terminals OUT1, OUT2 in accordance with a latch signal LB, a high level holding circuit portion 70 constituted by two PMOS transistors Q71, Q72 and two capacitors C71, C72 for maintaining each voltage level of the output terminals to a logical high-state only when a latch operation is not performed, and an amplifying/determining circuit portion 80 having a positive feedback structure constituted by two PMOS transistors Q81, Q82 for amplifying the current signals and determining level of an objective signal.

In this comparator circuit, the latch signal LB is commonly connected to gates of the transistors Q61, Q62 of the switching circuit portion 60. When a latch operation is carried out, i.e. when the latch signal LB is a logical high level, the transistors Q61, Q62 all are made conductive, the current signals I51, I52 converted by the converting circuit portion 50 are supplied through the transistors Q61, Q62 of the switching circuit portion 60 to the transistors Q81, Q82 of the amplifying/determining circuit portion 80.

In addition, when a latch operation is not carried out, i.e. when the latch signal LB is a logical-low level, an electric potential of the output terminals OUT1, OUT2 is maintained at a logical high level by the high level holding circuit portion 70.

Hereinafter, operation of the comparator circuit of FIG. 3 will be described with reference to FIGS. 4A to 4D.

The comparator circuit of FIG. 3 has a different operation from the comparator circuit of FIG. 1. This is that, when the latch signal LB is a low level, the transistors Q61, Q62 for switching electrical connection of the input and output terminals are not made conductive and thus any current consumption does not occur.

In detail, when the latch signal LB is a low level, i.e. during a time interval t0–t1 of FIG. 4A, the transistors Q61, Q62 of the switching circuit portion 50 are not made conductive and all the transistors Q71, Q72 are made conductive, and therefore each of the output terminals OUT1, OUT2 has a high level in electric potential, as shown in FIG. 4C. As a result, it is seen from FIG. 4D that a current consumption becomes zero, as shown by the time interval t0–t1 of FIG. 4D.

When the latch signal LB is a high level at the time t1, the transistors Q71, Q72 are not made conductive, and thus the output terminals OUT1, OUT2 become free from a locking state of output operation. Then, the transistors Q61, Q62 all are made conductive, and thus the current signals I51, I52 occurring due to application of the input comparing signals CS1, CS2 start to be quantitatively increased, respectively.

However, since a voltage of the input comparison signal CS1 is higher than that of the reference signal CS2 at the time t1 as shown in FIG. 4B, the electric potential of the output terminal OUT1 is further lowered in comparison with that of the output terminal OUT2.

Since the transistors Q81, Q82 are connected with each other in a positive feedback structure, an electric potential difference between the two output terminals is rapidly amplified, and thus the voltage level of the input comparison signal CS1 can be determined in the circuit portion 80, as shown in FIG. 4C.

The current consumption in the comparator circuit of FIG. 3 will be described in detail below.

First, the current consumption is zero while the latch signal LB is a low level, but additional power is required in order to drive the capacitors C71, C72 serving as loads, when the level of the output signal is changed, i.e. at the time t1 or t2.

In the case where the latch signal is a high level, the transistors Q61, Q62 also are made conductive at the time t1, and then the current signals I51, I52 pass through the transistors Q51, Q52 to the second voltage source VSS as a ground. Then, the voltage of each one of output terminals OUT1, OUT2 is dropped.

The transistors Q81, Q82 also are made conductive, and current signals from the first voltage source VDD flow to the ground VSS through the transistors Q61, Q51 connected in series, and the transistors Q62, Q52 connected in series, respectively. Then, a large amount of current flows instantaneously.

On the other hand, after determining an electric potential difference between the output terminals OUT1, OUT2 just after the time t1, the electric potential of the output terminal OUT1 becomes low and that of the output terminal OUT2 becomes high. Then, since the potential of the output terminal OUT2 is high, the transistor Q81 is not made conductive, and thus a current flow is interrupted from the second voltage source VDD to the transistor Q61.

Also, since the potential of the output terminal OUT1 is low, the transistor Q82 is continuously made conductive, and thus a current signal flows from the second voltage source VDD to the ground VSS. Then, an amount of current flowing from VSS to VDD is determined by the voltage level of the input comparison signal CS2.

On the other hand, during the time interval of t1–t2, the voltage level of the input comparison signal CS2 is constant, and thus a current consumption also is constant, as shown in FIG. 4D.

During the interval of after the time t3 to just before the time t4, the transistor Q82 is not made conductive and the transistor Q81 is made conductive because the initial level of the input comparison signal CS1 is lower than that of the input comparison signal CS2. Accordingly, the amount of current flowing through the transistors Q61, Q51 is varied in accordance with the voltage level of the input comparison signal CS1.

As described above, in any one of the comparator circuits of FIGS. 1 and 3, since a current signal flows continuously therein even after the logical level of an input comparison signal is determined, power consumption can not be sufficiently reduced.

In addition, in the case where the prior art comparator circuit is embodied in an A/D convertor, the A/D converter having an 8-bit resolution requires a total of 256 comparator circuits, and thus a power-consumption in such an A/D converter can not be neglected.

Particularly, if it is necessary to embody an A/D converter in a portable system, a comparator with as low in power-consumption as possible must be embodied in such an A/D converter.

SUMMARY OF THE INVENTION

It is an object of the present invention to provide a comparator circuit in which a current flowing does not occur during a normal operation thereof so as to minimize a power-consumption therein.

According to one aspect of the present invention, a low power-consumption type comparator circuit has two input terminals for receiving two input signals, one of which is an input reference signal and the other of which is an input comparison signal, and two output terminals, the circuit comprising signal converting means for converting the input signals into current signals, respectively; switching means for controlling transmission of the current signals to output terminals of the circuit in response to a latch signal indicating a latch operation or a normal operation of the circuit; high level holding means for maintaining each voltage level of the output terminals to a logical high-state only when the latch operation of the circuit is not performed; amplifying/determining means for amplifying the current signals and determining logical level of the input comparison signal; and output feedback means for receiving output signals of the output terminals and enabling to boast-up a gain, only while the circuit is at the latch operation.

In this comparator circuit, said signal converting means comprises two transistors arranged in a differential amplifier structure, one of which receives the input comparison signal through a gate thereof, and the other of which receives the input reference signal through a gate terminal thereof.

In this comparator circuit, said switching means comprises two transistors connected in parallel with each other, which are made conductive in accordance with logical level of the latch signal to be applied through each gate terminal thereof.

In this comparator circuit, said switching means comprises one transistor connected between the signal converting means and the ground, which are made conductive in accordance with a logical level of the latch signal to be applied through a gate terminal thereof.

According to a further aspect of the present invention, the low power-consumption type comparator circuit having two input terminals for receiving two input signals, one of which is an input reference signal and the other of which is an input comparison signal, and two output terminals, the circuit comprising signal converting means for converting each voltage of input signals into current signals; switching/feedback means for controlling transmission of the current signals to the output terminals during performing a latch operation of the circuit and feeding back output signals of the output terminals thereto; high level holding means for maintaining each voltage level of the output terminals to a logical high-state only when the latch operation is not performed; amplifying/determining means for amplifying the current signals and determining the logical level of the input comparison signal; output switching means for the controlling transmission of output signals to control terminals of the switching/feedback means; and low level holding means for maintaining each voltage level of the control terminals of the switching/feedback means to a logical low-state so as to enable the switching/feedback circuit portion not to be made conductive only when the latch operation is not performed.

In this comparator circuit, the output switching means is constituted by two transmission gates, in which drain and source are coupled to each other.

In this comparator circuit, said signal converting means comprises two transistors arranged in a differential amplifier structure, one of which receives the input comparison signal through a gate thereof, and the other of which receives the input reference signal through a gate thereof.

According to another aspect of the present invention, the low power-consumption type comparator circuit having two input terminals for receiving two input signals, one of which is an input reference signal and the other of which is an input comparison signal, and two output terminals, the circuit comprising signal converting means for converting each voltage of input signals into current signals; switching means for controlling transmission of the current signals to the output terminals in accordance with a latch signal; high level holding means for maintaining each voltage level of the output terminals to a logical high-state only when a latch operation is not performed; amplifying/determining means for amplifying the current signals and determining logical level of the input comparison signal; and output level establishing means for enabling output signals of the output terminals to be equal to each potential of a VDD voltage or a ground level.

In the comparator circuit, said signal converting means comprises two transistors arranged in a differential amplifier structure, one of which receives the input comparison signal through a gate thereof, and the other of which receives the input reference signal through a gate terminal thereof.

In the comparator circuit, said switching means comprises two transistors connected in parallel with each other, which are made conductive in accordance with logical level of the latch signal to be applied through each gate terminal thereof.

According to an additional embodiment of the present invention, the low power-consumption type comparator circuit having two input terminals for receiving two input signals, one of which is an input reference signal and the other of which is an input comparison signal, and two output terminals, the circuit comprising first and second transistors connected in parallel with each other, for receiving the input signals through each gate thereof and converting the input signals into current signals, respectively; third and fourth transistors connected in parallel with each other, for controlling transmission of the current signals to output terminals of the circuit in response to a latch signal indicating a latch operation or a normal operation of the circuit, said latch signal being commonly applied through each gate thereof; fifth and sixth transistors connected in parallel with each other, for maintaining each voltage level of the output terminals to a logical high-state only when the latch operation of the circuit is not performed; seventh and eighth transistors connected in parallel with each other, for amplifying the current signals and determining a logical level of the input comparison signal, each gate of the seventh and eighth transistors being connected to each of the output terminals; and ninth and tenth transistors connected in parallel with each other, for receiving output signals of the output terminals and enabling to make a current flowing in the circuit to a zero current-state, only while the circuit is at the latch operation, each source of the ninth and tenth transistors being connected to a ground.

According to another embodiment of the present invention, the low power-consumption type comparator circuit having two input terminals for receiving two input signals, one of which is an input reference signal and the other of which is an input comparison signal, and two output terminals, the circuit comprising first and second transistors connected in parallel with each other, for receiving the input signals through each gate thereof and converting the input signals into current signals, respectively; third and fourth transistors connected in parallel with each other, for controlling transmission of the current signals to output terminals of the circuit in response to a latch signal indicating a latch operation or a normal operation of the circuit, said latch signal being commonly applied through each gate thereof; fifth and sixth transistors connected in parallel with each other, for maintaining each voltage level of the output terminals to a logical high-state only when the latch operation of the circuit is not performed; seventh and eighth transistors connected in parallel with each other, for amplifying the current signals and determining a logical level of the input comparison signal, each gate of the seventh and eighth transistors being connected to each of the output terminals; and a ninth transistor connected between each source of the first and second transistors and a ground, for receiving output signals of the output terminals and enabling to make a current flowing in the circuit to a zero-state, only while the circuit is at the latch operation.

According to a further aspect of the present invention, the low power-consumption type comparator circuit having two input terminals for receiving two input signals, one of which is an input reference signal and the other of which is an input comparison signal, and two output terminals, the circuit comprising first and second transistors connected in parallel with each other, for receiving the input signals and converting each voltage of input signals into current signals; third and fourth transistors connected in parallel with each other for controlling transmission of the current signals to the output terminals during performing a latch operation of the circuit and feeding back output signals of the output terminals to gates thereof, respectively; fifth and sixth transistors connected in parallel with each other for maintaining each voltage level of the output terminals to a logical high-state only when the latch operation is not performed; seventh and eighth transistors connected in parallel with each other for amplifying the current signals and determining level of the input comparison signal; ninth to twelfth transistors for the controlling transmission of output signals to gates of the third and fourth transistors; and thirteenth and fourteenth transistors connected in parallel with each other for maintaining each voltage level of the gates of the third and fourth transistors to a logical low level so as to enable the third and fourth transistors not to be made conductive only when the latch operation is not performed.

In this comparator circuit, the ninth to twelfth transistors constitute two transmission gates, each of which is composed of a PMOS-NMOS transistor pair in which drain and source are coupled to each other.

In this comparator circuit, two NMOS transistors of each of the transmission gates are provided to reduce each resistance of two PMOS transistors which are made conductive when all the output signals of the output terminals are low level.

According to a further embodiment of the present invention, the low power-consumption type comparator circuit having two input terminals for receiving two input signals, one of which is an input reference signal and the other of which is an input comparison signal, and two output terminals, the circuit comprising first and second transistors connected in parallel with each other, for receiving the input signals and converting each voltage of input signals into current signals; third and fourth connected in parallel with each other for controlling transmission of the current signals to the output terminals in accordance with a latch signal; fifth and sixth transistors connected in parallel with each other for maintaining each voltage level of the output terminals to a logical high level only when a latch operation is not performed; seventh and eighth transistors connected in parallel with each other for amplifying the current signals and determining logical level of the input comparison signal; and ninth to twelfth transistors for enabling output signals of the output terminals to be equal to each potential of the input signals or a ground level.

In the above-described comparator circuit, only at the moment that a logical level of the latch signal is changed do signal levels of the output terminals instantaneously change, thereby causing a current signal to flow in the comparator circuit. However, during a normal operation, since a current signal does not flow therein, no current-consumption occurs. Therefore, the comparator circuit has a low power-consumption characteristic.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 5:
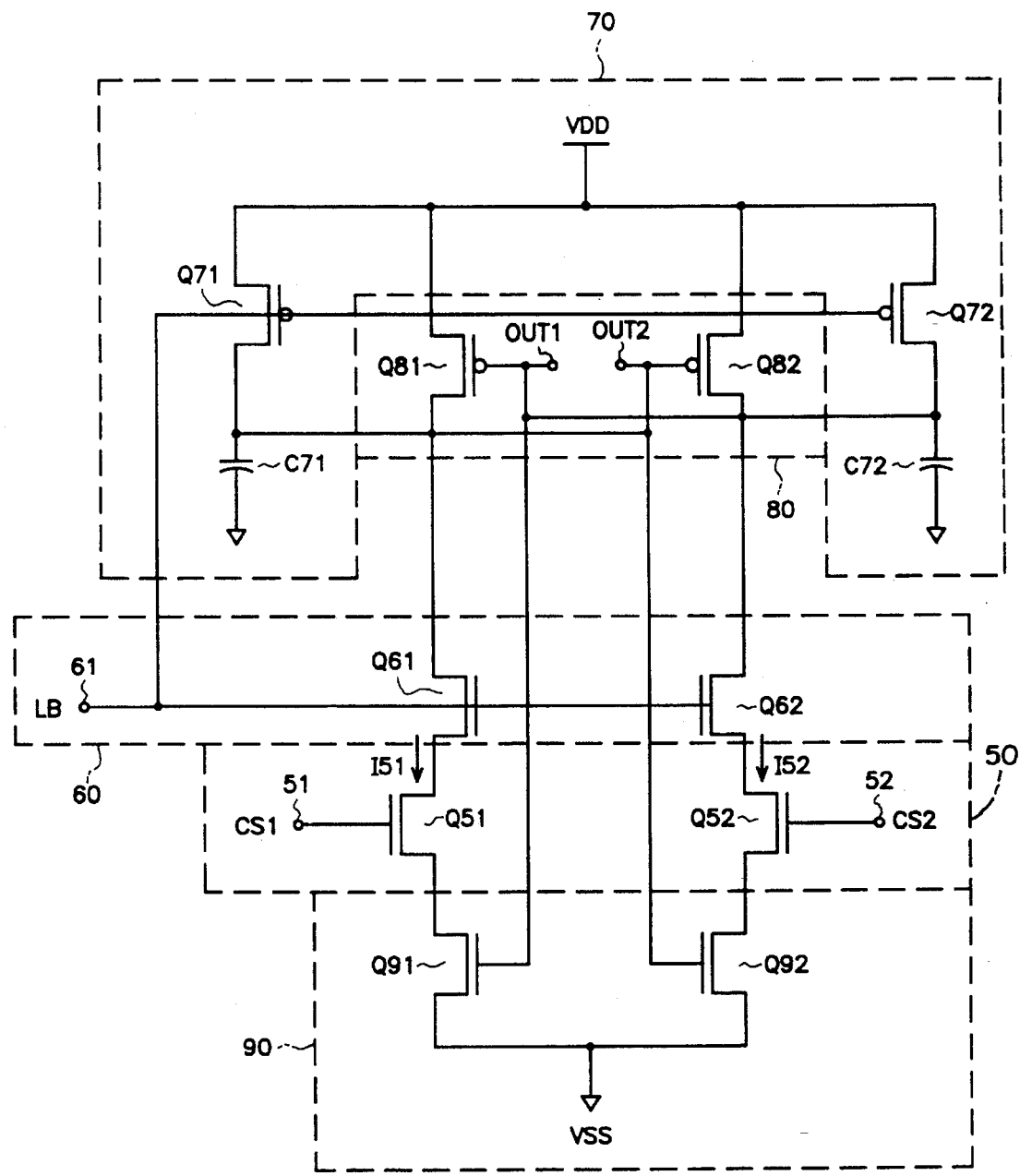
FIG. 5 is a circuit diagram showing the construction of a low power-consumption type comparator circuit according to a preferable embodiment of the present invention.

FIG. 5 shows the construction of a low power-consumption type comparator circuit according to one embodiment of the present invention. It is seen from FIG. 5 that the comparator circuit of the present invention has the same construction as that of FIG. 3 except that two additional transistors are provided between a switching circuit portion and a first voltage source to feed back output signals thereof. Component elements having similar functions to the component elements of the prior art comparator circuit (shown in FIG. 3) are indicated by the same reference numerals.

Referring to FIG. 5, the comparator circuit of the present invention comprises a signal converting circuit portion 50 constituted by two NMOS transistors Q51, Q52 for converting each voltage of input signals CS1, CS2 into current signals I51, I52, a switching circuit portion 60 constituted by two NMOS transistors Q61, Q62 for controlling transmission of the current signals to output terminals OUT1, OUT2 in accordance with a latch signal LB, a high level holding circuit portion 70 constituted by two PMOS transistors Q71, Q72 and two capacitors C71, C72 for maintaining each voltage level of the output terminals OUT1, OUT2 to a logical high-state only when a latch operation is not performed, an amplifying/determining circuit portion 80 having a positive feedback structure constituted by two PMOS transistors Q81, Q82 for amplifying the current signals and determining the level of an objective signal, and an output feedback circuit portion 90 constituted by two NMOS transistors Q91, Q92 to enable a circuit current to be at a zero-state by feeding back the output signals only while the comparator circuit is performing a latch operation, i.e. not during a normal operation. One of the two input signals is an input comparison signal CS1 and the other is an input reference signal CS2.

In the comparator circuit, the latch signal LB is commonly connected to gates of the transistors Q61, Q62 of the switching circuit portion 60. When a latch operation is carried out, i.e. when the latch signal LB is a logical high level, the transistors Q61, Q62 are made conductive, the current signals I51, I52 converted by the converting circuit portion 50 are supplied through the transistors Q61, Q62 of the switching circuit portion 60 to the transistors Q81, Q82 of the amplifying/determining circuit portion 80.

In addition, when a latch operation is not carried out, i.e. when the latch signal LB is a logical low level, the output terminals OUT1, OUT2 all are maintained at a high voltage level.

Figure 1:
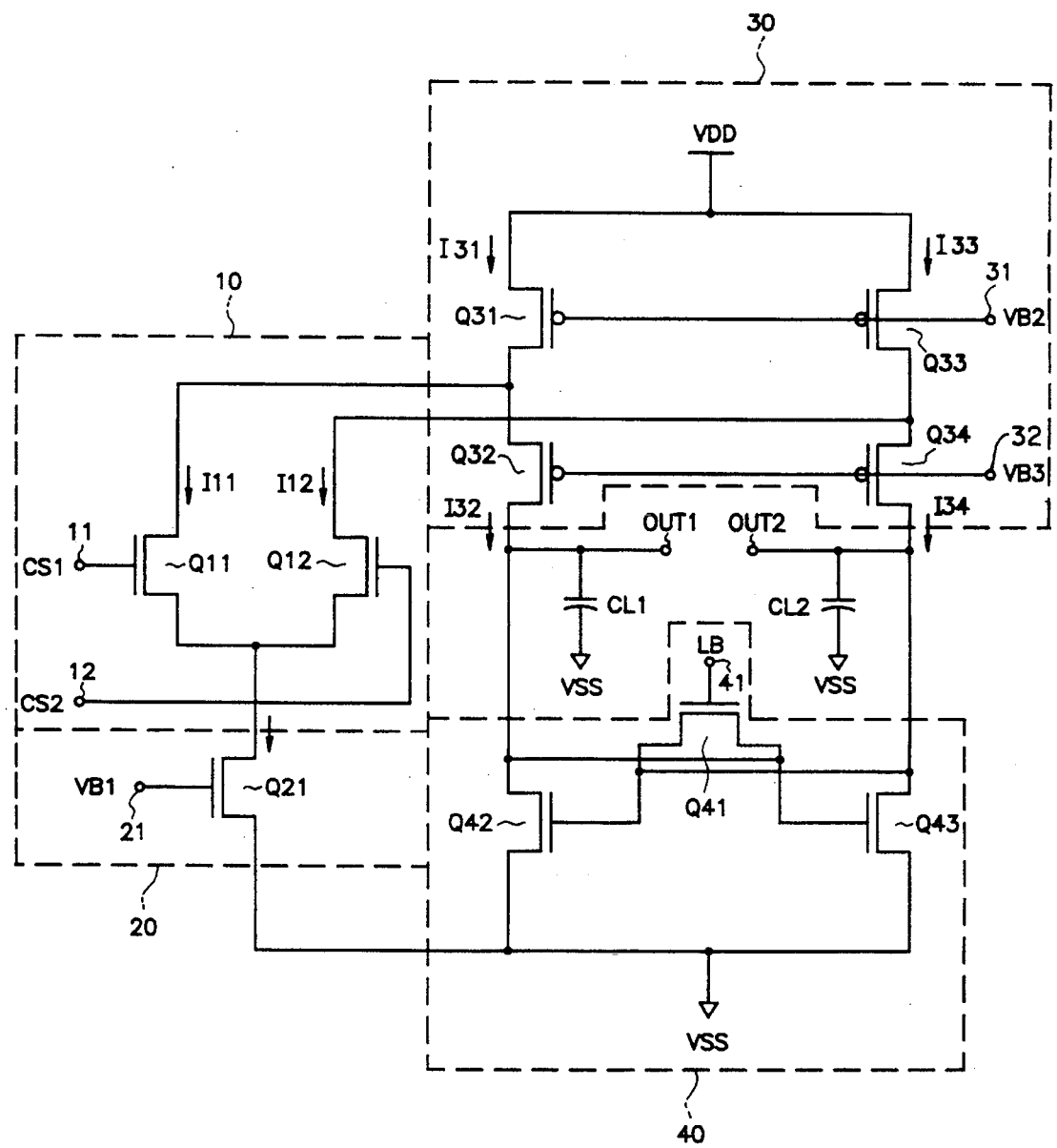
FIG. 1 is a circuit diagram showing the construction a typical one of prior art comparator circuits.
Figure 2:
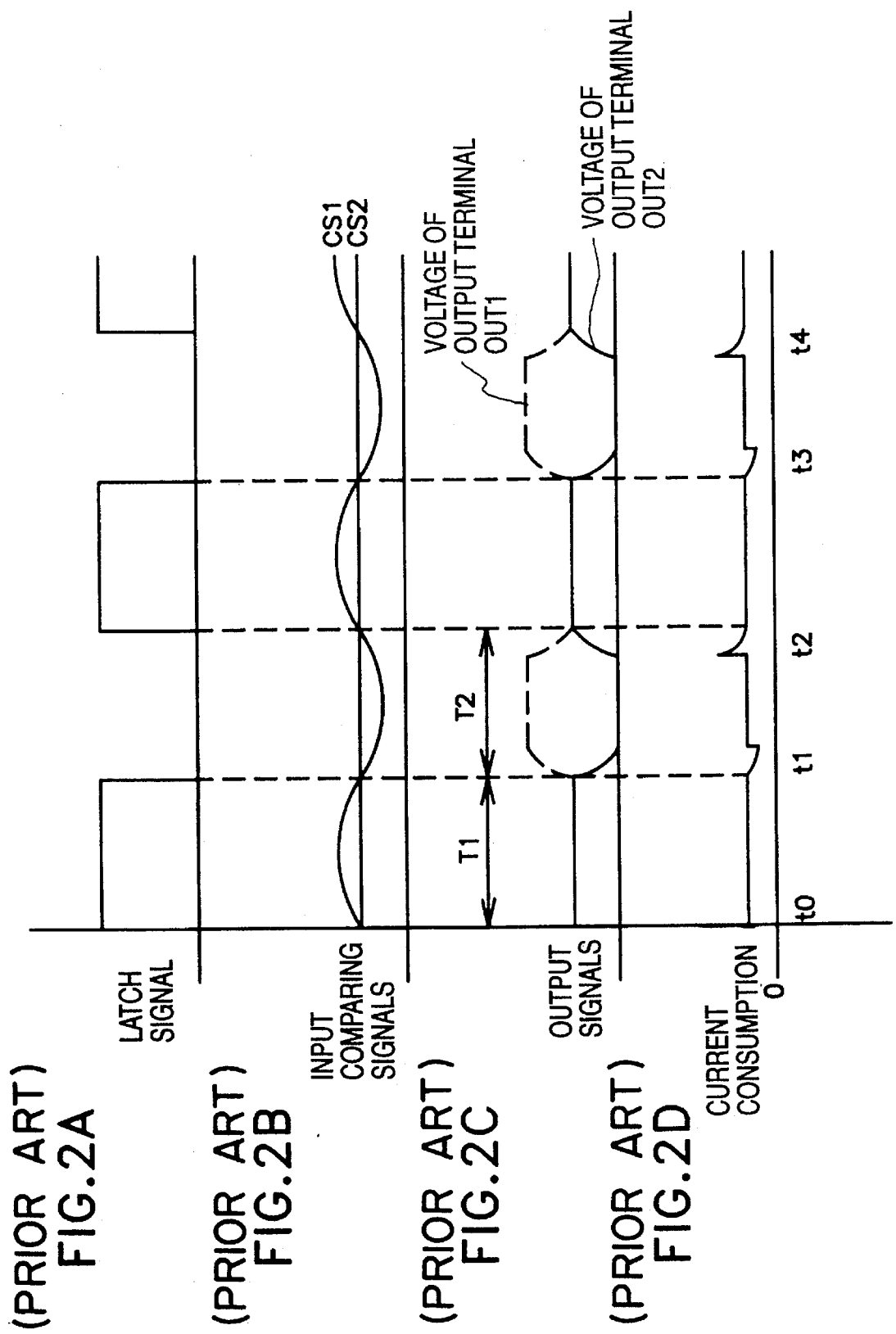
FIGS. 2A to 2D are timing diagrams showing the operation of the prior art comparator circuit of FIG. 1.
Figure 3:
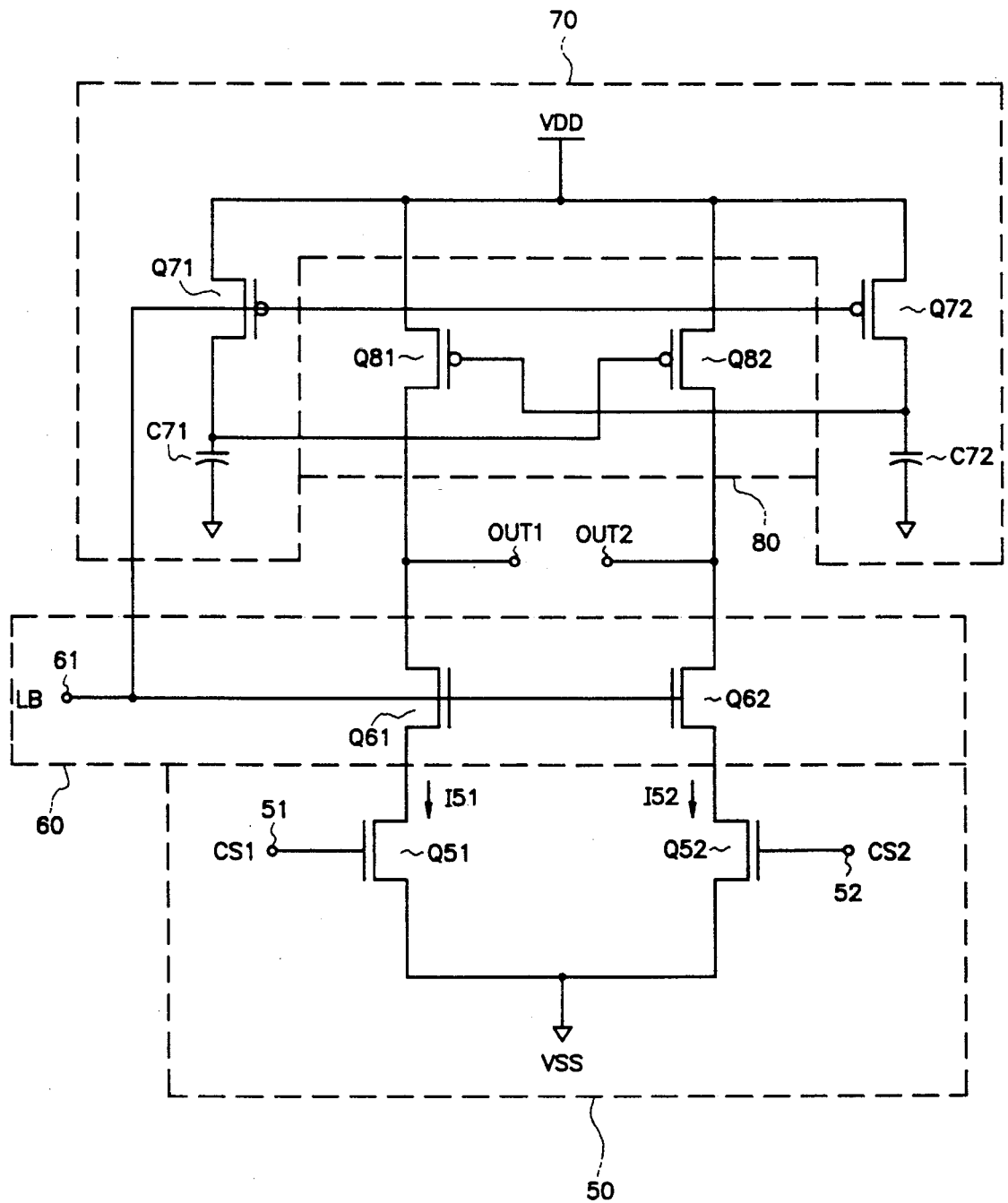
FIG. 3 is a circuit diagram showing the construction of another prior art comparator circuit with a low power-consumption.
Figure 4:
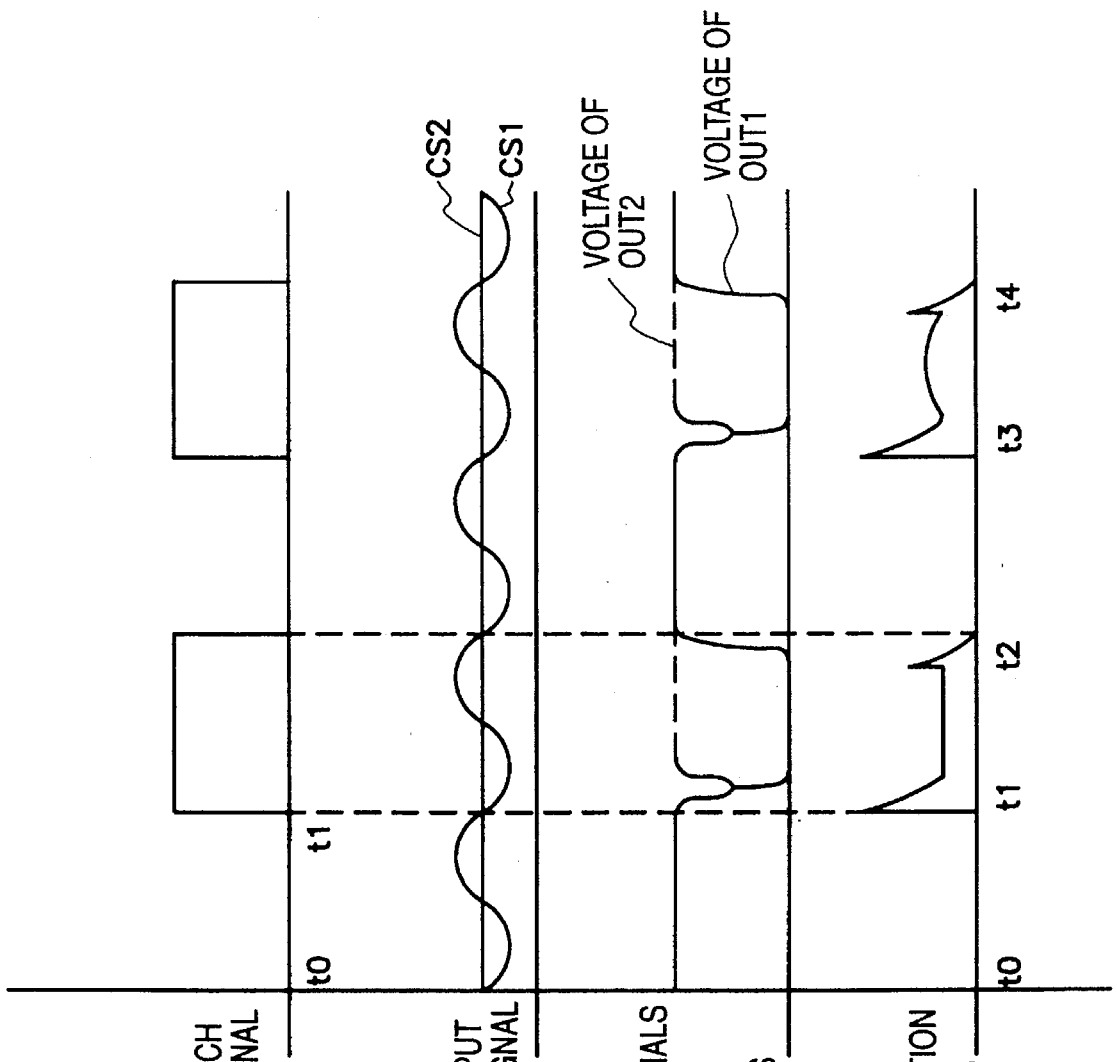
FIGS. 4A to 4D are timing diagrams showing the operation of the prior art comparator circuit of FIG. 3.

As described above, since the comparator circuit of FIG. 5 further comprises the output feedback circuit portion 90 in addition to that of FIG. 3, no power-consumption occurs during a normal operation. As a result, whole power-consumption in the comparator circuit can be minimized.

Hereinafter, operation of the comparator circuit of FIG. 5 will be described with reference to FIGS. 6A to 6D.

Figure 6:
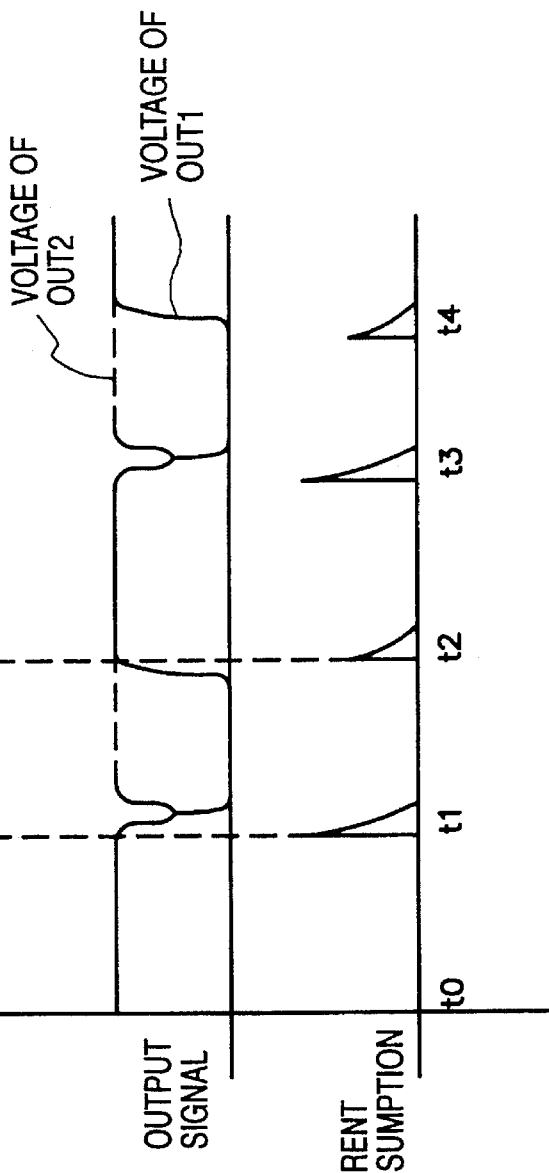
FIGS. 6A to 6D are timing diagrams showing the operation of the prior art comparator circuit of FIG. 5.

First, when the latch signal LB is a low level, i.e. during a time interval t0–t1 of FIG. 6A, the transistors Q61, Q62 of the switching circuit portion 60 are not made conductive, and then current flowing between the input and output terminals is interrupted. All of the transistors Q71, Q72 are made conductive, and then each of the output terminals OUT1, OUT2 is at a high level, i.e. an electric potential difference of the two output terminals is zero, as shown in FIG. 6C. Then, since the output signals from the output terminals OUT1, OUT2 are respectively fed back to gates of the transistors Q91, Q92 in the output feedback circuit portion 90, the transistors Q91, Q92 all are made conductive. Also, although each of the transistors Q51, Q52 has an electric conductivity corresponding to each of the input signals CS1, CS2, each drain potential thereof is tied to a ground potential VSS through transistors Q91 and Q92, respectively. At the same time, since the transistors Q61, Q62 are not made conductive, a current-consumption in the comparator circuit becomes zero during the time interval of t0–t1, as shown in FIG. 6D.

Subsequently, just after the time t1, the latch signal LB is changed to from low level to high level, transistors Q71, Q72 are turned off. The output terminals OUT1, OUT2 then are released from the output holding state, but just after the time t1 the output terminals are instantaneously maintained at a high level by capacitors C71 and C72, respectively. Thus, the transistors Q91, Q92 all are still made conductive. However, since the latch signal LB is already changed to a high level after the time t1, the transistors Q61, Q62 all are made conductive, and thus current signals corresponding to the input signals CS1, CS2 start to flow therethrough.

If one of the input signals, for example CS1, is higher in electric potential than the other, the current signal I51 flowing through the transistor Q61 becomes greater in amount than the current signal I52 flowing through the transistor Q62. In this case, an electric potential of the output terminal OUT2 is further lowered in comparison with that of the output terminal OUT1 because it is tied to the drain of transistor Q81 which in this example is in the circuit with the greatest current flow. As a result, an electric potential difference is produced between the output terminals OUT1, OUT2. Since the transistors Q81, Q82 are connected in a positive feedback structure, it is possible to instantaneously determine a logical level of the input comparing signal, even if a slight electric potential difference occurs between the output terminals. Hence, the potential of one of the output terminals becomes a ground level, and the other becomes a high level.

As described above, once the respective potential levels of the output signals have been determined, the respective circuits in which transistors Q81, Q82 are located are made non-conductive, the former by Q91 being turned off and the latter by transistor Q82 itself being turned off. Hence, in the time interval of when the output voltages have been set to just before the time t2, any current flowing from the high voltage source VDD has been interrupted. Therefore, current consumption in the comparator circuit becomes zero.

Additional, at the time t2, i.e. when the latch signal LB is changed again to a low level, the transistors Q61, Q62 are not made conductive and the transistors Q71, Q72 are made conductive. Thus, each electric potential of the output terminals OUT1, OUT2 is changed again to a high level, i.e. the output holding state. Even at this time, a charging operation is performed in the load capacitors, and therefore a current flows in the comparator circuit.

In the above-described embodiment, only at the moment that a logical level of the latch signal LB is changed, signal levels of the output terminals OUT1, OUT2 are instantaneously changed, thereby causing a current signal to flow in the comparator circuit. However, during a normal operation, since a current signal does not flow therein, no current-consumption occurs. Therefore, the comparator circuit has a low power-consumption characteristic.

FIGS. 7 to 13 are circuit diagrams showing the comparator circuits according to several embodiments of the present invention. In FIGS. 7 to 13, component elements having similar functions to the component elements of the comparator circuit of the first embodiment (shown in FIG. 5) are indicated by the same reference numerals, and descriptions thereof are omitted.

Figure 7:
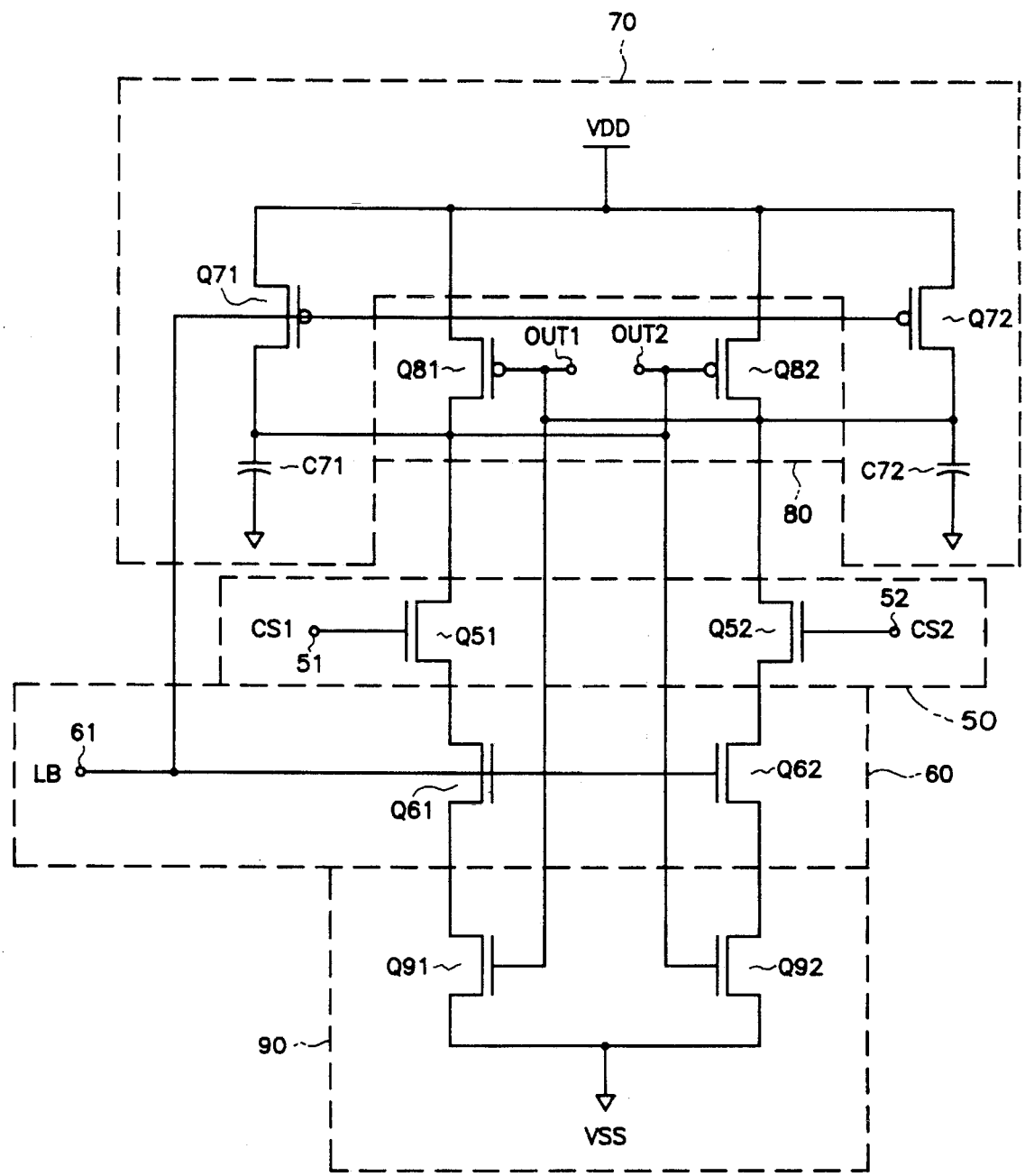
FIGS. 7 to 16 are circuit diagrams showing the constructions of comparator circuits according to other embodiments of the present inventions.

The comparator circuit according to a second embodiment of the present invention is shown in FIG. 7.

As shown in FIG. 7, the comparator circuit has the same structure as the circuit shown in FIG. 5 except that the signal converting circuit portion 50 and the switching circuit portion 60 are shifted to each other, and hence identical parts are denoted by the same reference numbers to omit redundant description.

In detail, as shown in FIG. 7, the switching circuit portion 60 is connected between the signal converting circuit portion 50 and the output feedback circuit portion 90, and the signal converting circuit portion 50 is connected between the amplifying/determining circuit portion 80 and the switching circuit portion 60. The comparator circuit of FIG. 7 has the same effects as the circuit of the first embodiment (shown in FIG. 5).

Figure 8:
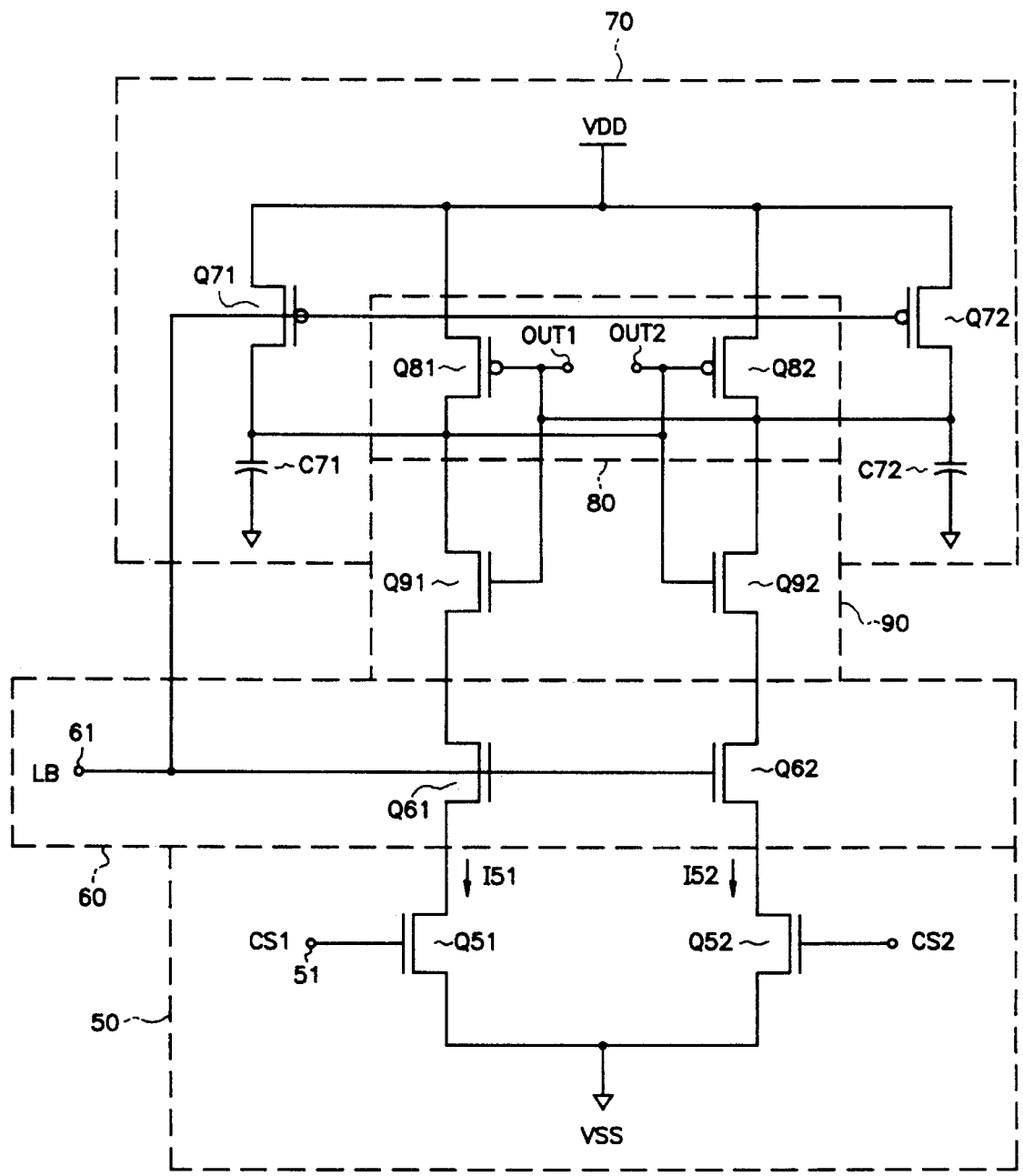

The comparator circuit according to a third embodiment of the present invention is shown in FIG. 8.

As shown in FIG. 8, the comparator circuit has the same structure as the circuit shown in FIG. 5 except that the output feedback circuit portion 90 is connected between the amplifying/determining circuit portion 80 and the switching circuit portion 60 and the signal converting circuit portion 50 is connected between the switching circuit portion 60 and the ground VSS, and hence identical parts are denoted by the same reference numbers to omit redundant description.

Figure 9:
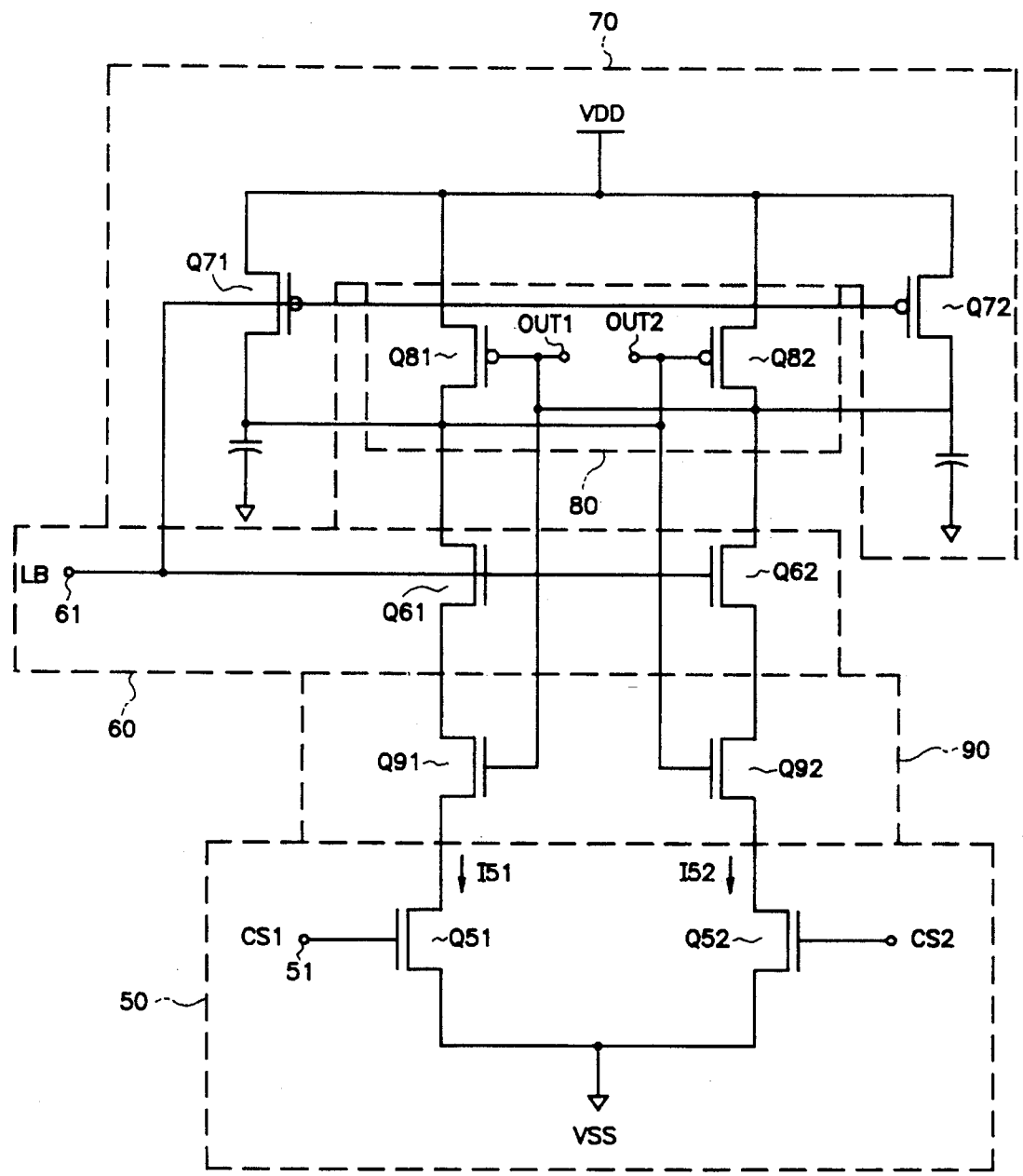

The comparator circuit according to a fourth embodiment of the present invention is shown in FIG. 9.

As shown in FIG. 9, the comparator circuit has the same structure as the circuit shown in FIG. 8 except that the switching circuit portion 60 and the output feedback circuit portion 90 are shifted to each other, and hence identical parts are denoted by the same reference numbers to omit redundant description.

In detail, as shown in FIG. 9, the switching circuit portion 60 is connected between the amplifying/determining circuit portion 80 and the output feedback circuit portion 90, and the signal converting circuit portion 50 is connected between the output feedback circuit portion 90 and the ground VSS. The comparator circuit of FIG. 9 has the same effects as the circuit of the second embodiment (shown in FIG. 7).

Figure 10:
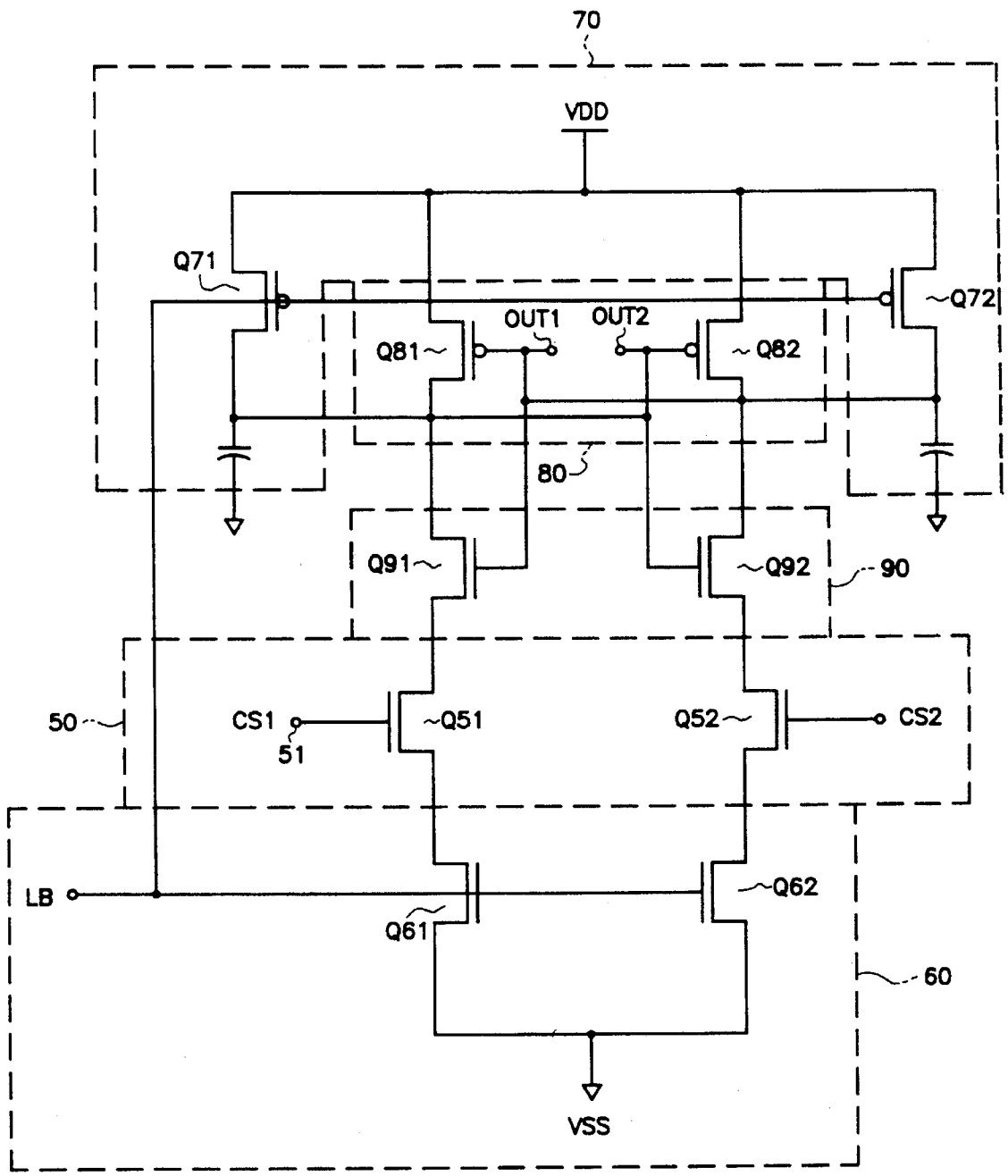

The comparator circuit according to a fifth embodiment of the present invention is shown in FIG. 10.

As shown in FIG. 10, the comparator circuit has the same structure as the circuit shown in FIG. 8 except that the switching circuit portion 60 and the signal converting circuit portion 50 are shifted to each other, and hence identical parts are denoted by the same reference numbers to omit redundant description.

In detail, the switching circuit portion 60 is connected between the signal converting circuit portion 50 and the ground VSS, and the signal converting circuit portion 50 is connected between the output feedback circuit portion 90 and the switching circuit portion 60. The comparator circuit of FIG. 10 has the same effects as the circuit of the second embodiment (shown in FIG. 7).

Figure 11:
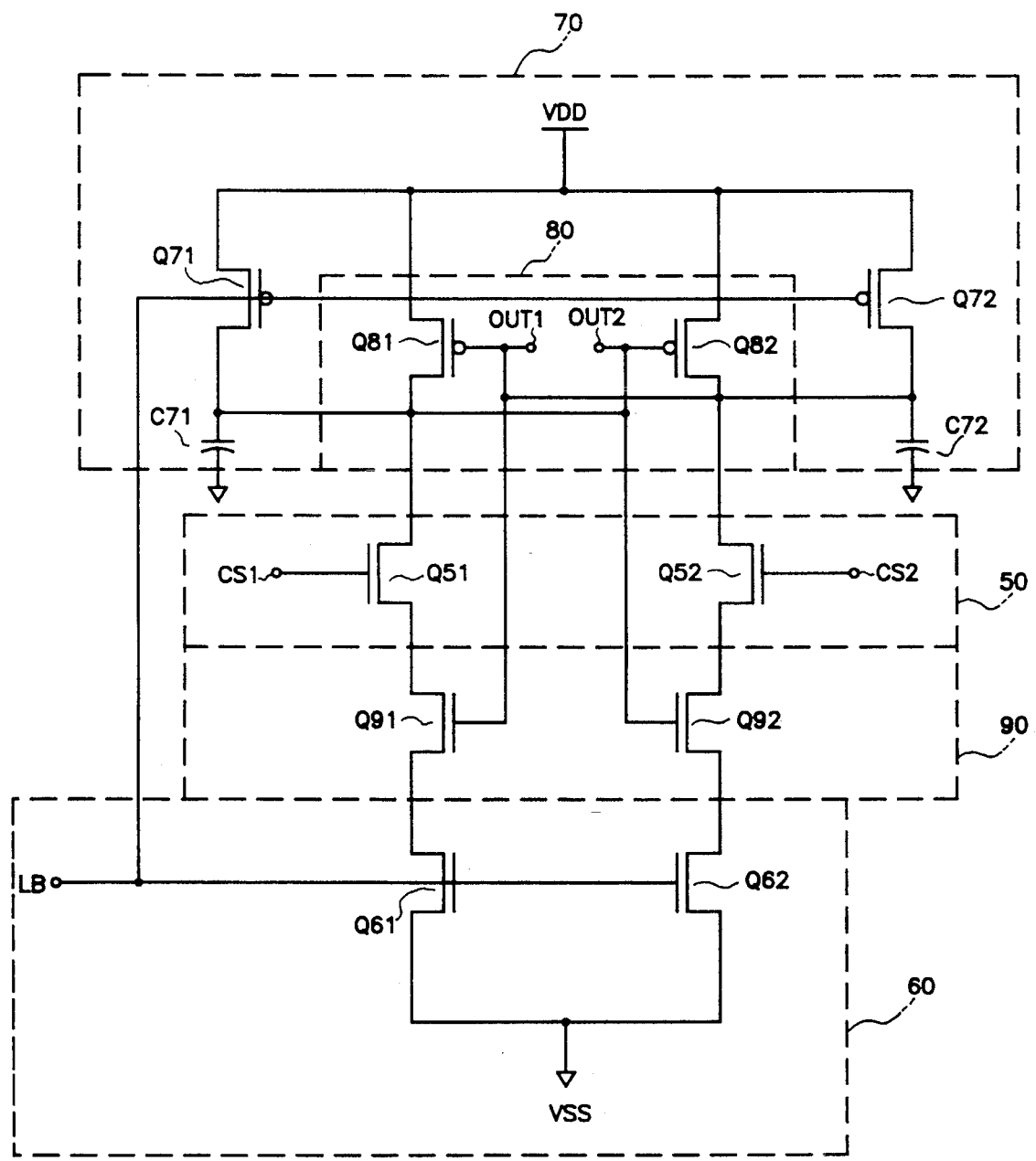

The comparator circuit according to a sixth embodiment of the present invention is shown in FIG. 11.

As shown in FIG. 11, the comparator circuit has the same structure as the circuit shown in FIG. 10 except that the signal converting circuit portion 50 and the output feedback circuit portion 90 are shifted to each other, and hence identical parts are denoted by the same reference numbers to omit redundant description.

In detail, as shown in FIG. 11, the signal converting circuit portion 50 is connected between the amplifying/determining circuit portion 80 and the output feedback circuit portion 90, and the switching circuit portion 60 is connected between the output feedback circuit portion 90 and the ground VSS. The comparator circuit of FIG. 11 has the same effects as the circuit of the second embodiment (shown in FIG. 7).

Figure 12:
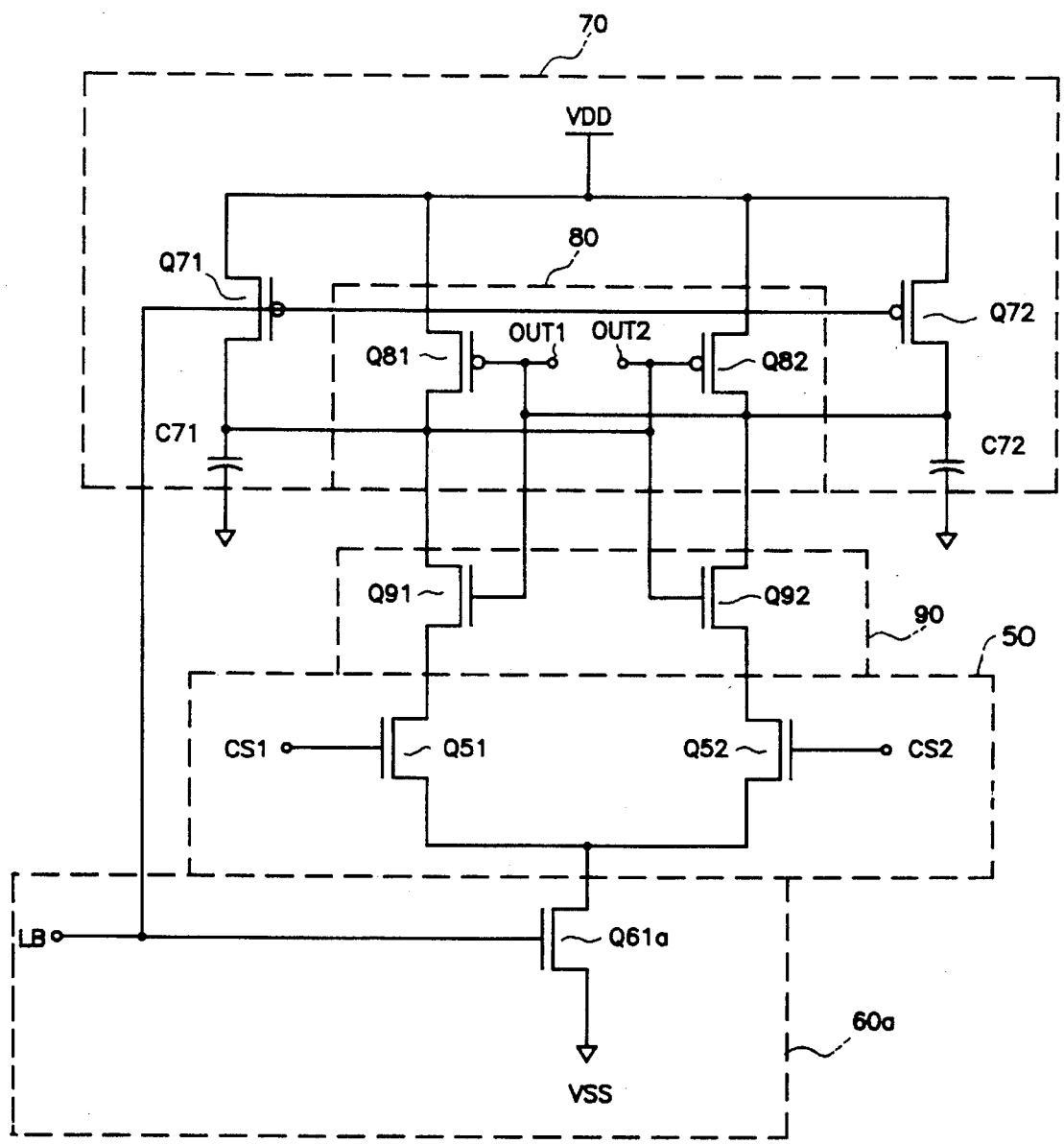

The comparator circuit according to a seventh embodiment of the present invention is shown in FIG. 12.

As shown in FIG. 12, the comparator circuit has the same structure as the circuit shown in FIG. 10 except that a switching circuit portion 60a is composed of only one transistor Q61a between the signal converting circuit portion 50 and the ground VSS, and hence identical parts are denoted by the same reference numbers to omit redundant description.

In detail, the transistor Q61a of the switching circuit portion 60a receives the latch signal LB through its gate, and is connected between each sources of the transistors Q51, Q52 of the signal converting circuit portion 50 and the ground VSS. The comparator circuit of FIG. 12 has the same effects as the circuit of the second embodiment (shown in FIG. 7). Also, the comparator circuit of FIG. 12 can be simplified in comparison to those of from the first embodiment to the sixth embodiment.

Figure 13:
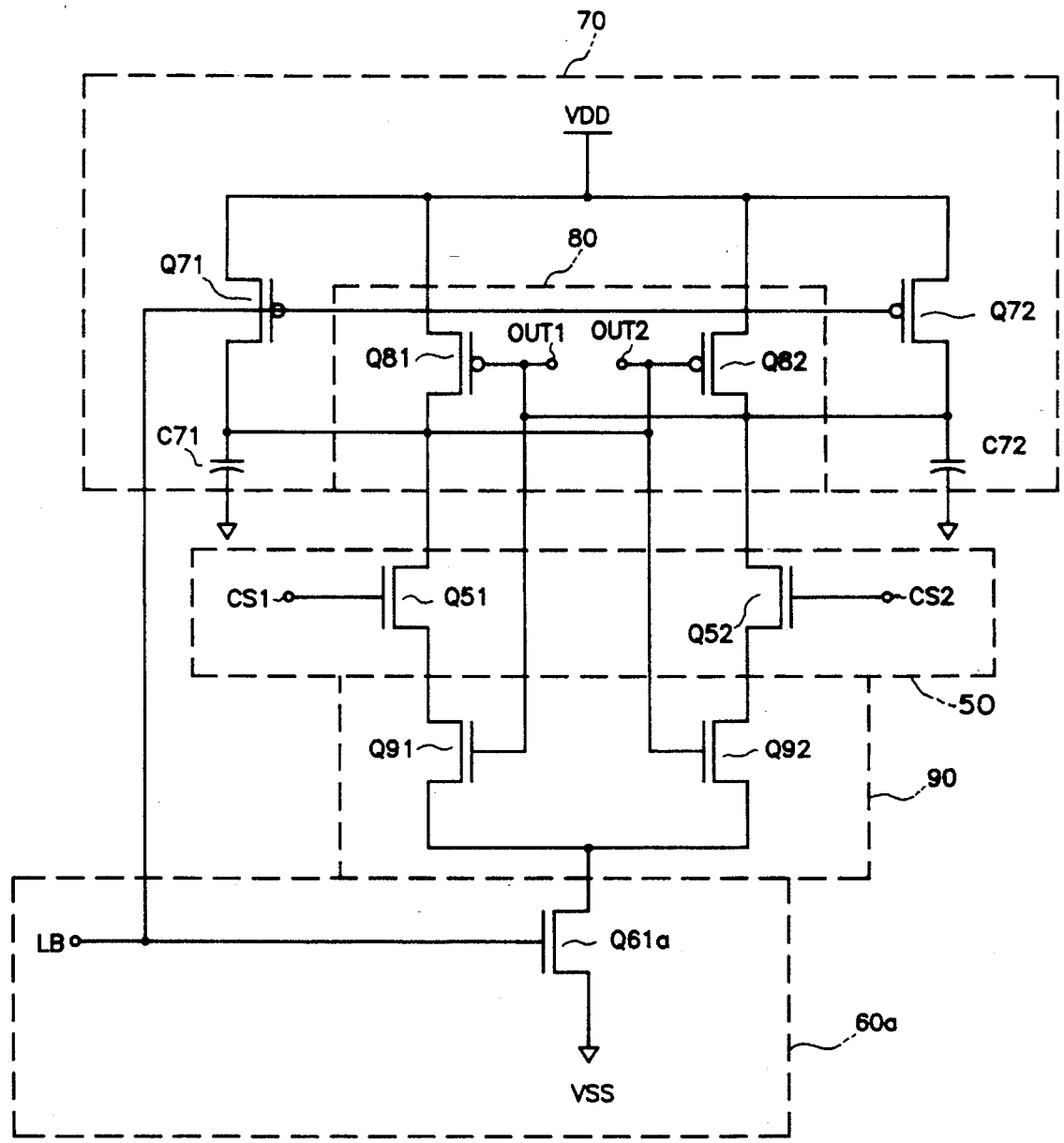

The comparator circuit according to an eighth embodiment of the present invention is shown in FIG. 13.

As shown in FIG. 13, the comparator circuit has the same structure as the circuit shown in FIG. 12 except that the signal converting circuit portion 50 and the output feedback circuit portion 90 are shifted to each other, and hence identical parts are denoted by the same reference numbers to omit redundant description.

In detail, as shown in FIG. 13, the signal converting circuit portion 50 is connected between the amplifying/determining circuit portion 80 and the output feedback circuit portion 90, and the output feedback circuit portion 90 is connected between the signal converting circuit portion 50 and a drain of the transistor Q61 in the switching circuit portion Q61a. The comparator circuit of FIG. 13 has the same effects as the circuit of the seventh embodiment (shown in FIG. 12).

Each of the above-mentioned embodiments of the present invention has the comparator circuit in which the transistors Q91, Q92 are connected in series in a main signal path between the first voltage source VSS (i.e. a ground) and the second voltage source VDD to feed back the output signals of the output terminals to gates of the transistors, respectively.

Figure 14:
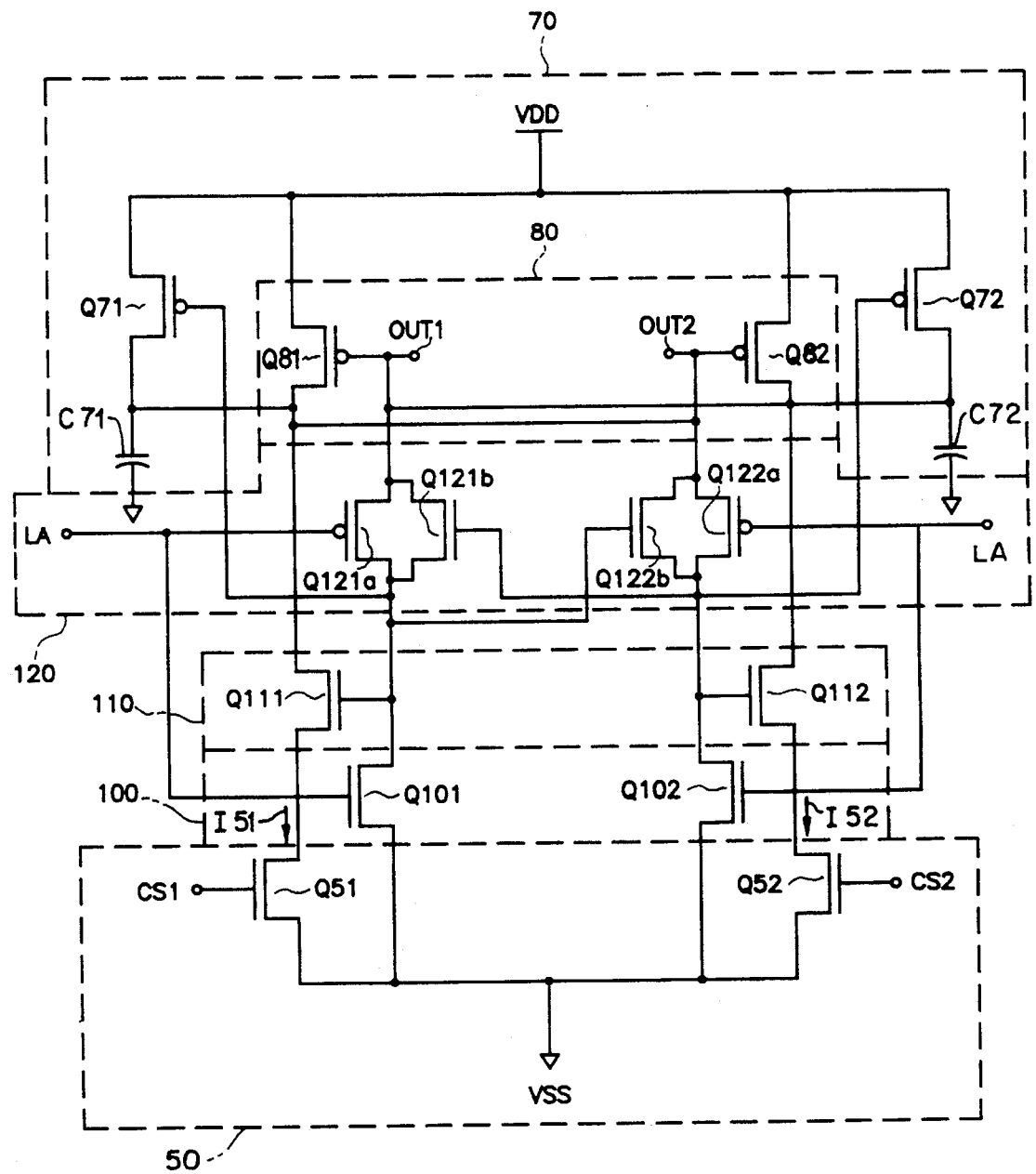
Figure 15:
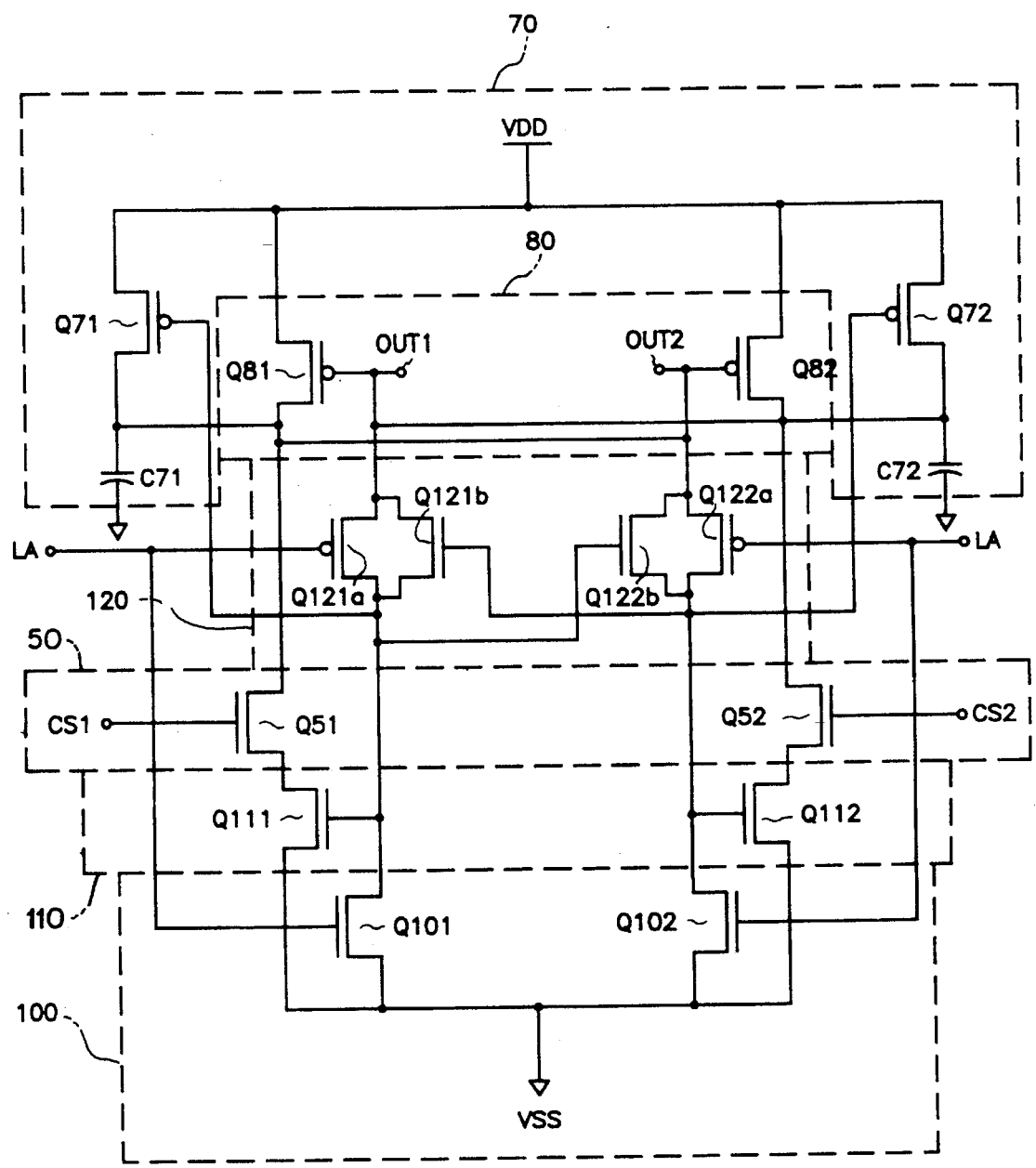
Figure 16:
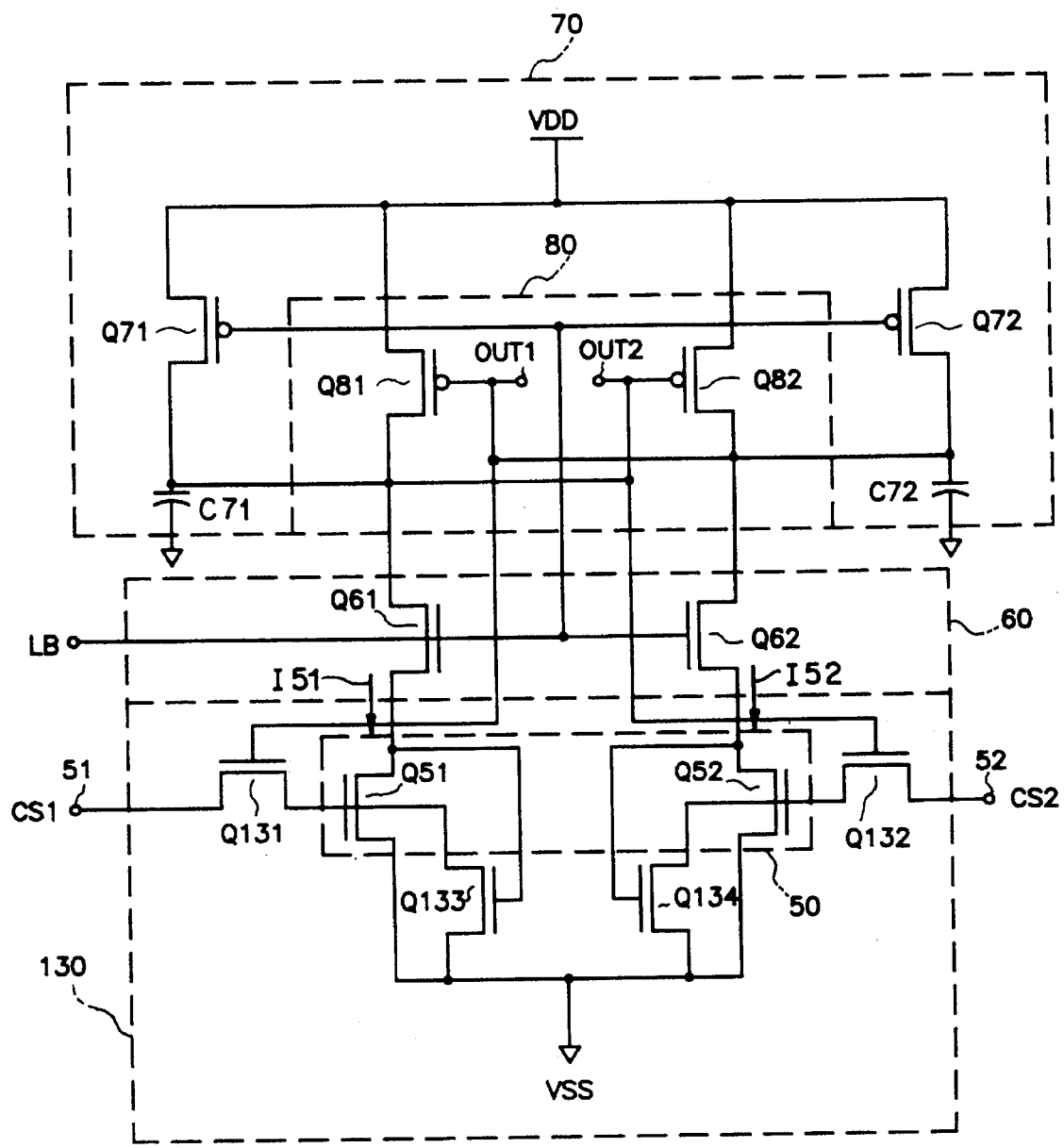

FIGS. 14 to 16 are circuit diagrams showing the comparator circuits according to ninth to eleventh embodiments of the present invention, each of which has a circuit construction for simultaneously performing a switching function and a feedback function in one component therein. In FIGS. 14 to 16, component elements having similar functions to the component elements of the comparator circuit of the first embodiment (shown in FIG. 5) are indicated by the same reference numerals, and descriptions thereof are omitted.

Referring to FIG. 14, the comparator circuit of the ninth embodiment comprises a signal converting circuit portion 50 constituted by two NMOS transistors Q51, Q52 for converting each voltage of input signals CS1, CS2 into current signals I51, I52, a switching/feedback circuit portion 110 constituted by two NMOS transistors Q111, Q112 for controlling transmission of the current signals to output terminals OUT1, OUT2 during performing a latch operation (i.e. when a latch signal is at a low level) and feeding back output signals of the output terminals thereto, a high level holding circuit portion 70 constituted by two PMOS transistors Q71, Q72 and two capacitors C71, C72 for maintaining each voltage level of the output terminals OUT1, OUT2 to a logical high-state only when the latch operation is not performed, an amplifying/determining circuit portion 80 having a positive feedback structure constituted by two PMOS transistors Q81, Q82 for amplifying the current signals and determining level of an input comparison signal, an output switching circuit portion 120 constituted by two transistor-pairs for the controlling transmission of output signals to gates of the transistors Q111, Q112 of the switching/feedback circuit portion 110, and a low level holding circuit portion 100 constituted by two NMOS transistors Q101, Q102 for maintaining each voltage level of gates of the transistors Q111, Q112 to a logical low-state so as to enable the switching/feedback circuit portion 110 not to be made conductive only when the latch operation is not performed.

In the comparator circuit, the output switching circuit portion 120 is constituted by two transmission gates, and each of the transmission gates is composed of a PMOS-NMOS transistor pair in which drain and source are coupled to each other. The NMOS transistors Q121b, Q122b of each transmission gate are provided to reduce each resistance of the PMOS transistors Q121a, Q122a which are made conductive when each potential of the output terminals is a low level.

Hereinafter, operation of the comparator circuit of FIG. 14 will be described.

First, when the latch signals LA are at a high level, i.e. when not performing the latch operation of the circuit, transistors Q121a, Q122a of the output switching circuit portion 120 are made not conductive, and then the gates of transistors Q111, Q122b, Q112, Q121b are electrically connected to the ground VSS. Thus, none of the transistors Q111, Q122b, Q112, Q121b are made conductive, and therefore current-consumption in the comparator circuit is at a zero-state.

On the other hand, when the latch signals LA are at low level, i.e. during a latch operation of the circuit or when the circuit is in a latch state, the transistors Q121a, Q122a all are made conductive, and then the transistors Q101, Q102 are not made conductive. Thus, each voltage of the output terminals OUT1, OUT2 are fed back to the gates of the transistors Q111, Q112. Then, the current signals converted by the transistors Q51, Q52 flows through the transistors Q111, Q112 to the ground VSS.

In this case, when a voltage level of the input signal CS1 is higher than that of the other input signal CS2, the output terminal OUT2 and the gate of the transistor Q112 have a low potential corresponding to the ground VSS, but the output terminal OUT1 and the gate of the transistor Q111 have a high potential corresponding to the supply source VDD. Thus, none of the transistors Q81, Q71, Q51 are made conductive, and therefore current-consumption in the circuit becomes zero.

The comparator circuit according to the tenth embodiment of the present invention is shown in FIG. 15.

As shown in FIG. 15, the comparator circuit has the same structure as the circuit shown in FIG. 14 except that the signal converting circuit portion 50 is connected between the output switching circuit portion 120 and the switching/feedback circuit portion 110, and the low level holding circuit portion 100 is connected between the switching/feedback circuit portion 110 and the ground VSS, and hence identical parts are denoted by the same reference numbers to omit redundant description. Operation of the comparator circuit of FIG. 15 is similar to that of the comparator circuit of FIG. 14. Also, the comparator circuit of FIG. 15 has the same effects as the circuit of the ninth embodiment (shown in FIG. 14).

In the operation of the comparator circuit of FIG. 15, which is similar to the operation of the comparator circuit of FIG. 14, when the latch signals LA are at a high level, i.e. when not performing the latch operation of the circuit, transistors Q121a, Q122a of the output switching circuit portion 120 are made not conductive, and then the gates of transistors Q111, Q122b, Q112, Q121b are electrically connected to the ground VSS. Thus, none of the transistors Q111, Q122b, Q112, Q121b are made conductive, and therefore a current-consumption in the comparator circuit is zero.

On the other hand, when the latch signals LA are at a low level, i.e. during a latch operation of the circuit, the transistors Q121a, Q122a are made conductive, and then the transistors Q101, Q102 become non conductive. Thus, the voltages of the output terminals OUT1, OUT2 are fed back to the gates of the transistors Q111, Q112. Then, the current signals converted by the transistors Q51, Q52 flow through the transistors Q111, Q112 to the ground VSS.

In this case, when a voltage level of the input signal CS1 is higher than that of the other input signal CS2, the output terminal OUT2 and the gate of the transistor Q112 have a low potential corresponding to the ground VSS, but the output terminal OUT1 and the gate of the transistor Q111 have a high potential corresponding to the supply source VDD. Thus, none of the transistors Q81, Q71, Q51 are made conductive, and therefore current-consumption in the circuit becomes zero.

The comparator circuit according to the eleventh embodiment of the present invention is shown in FIG. 16.

As shown in FIG. 16, the comparator circuit has the same structure as the circuit shown in FIG. 5 except that the output feedback circuit portion 90 of FIG. 5 is replaced by an output level establishing circuit portion 130 for enabling output signals of the output terminals OUT1, OUT2 to be equal to each potential of the input signals or a ground VSS, and hence identical parts are denoted by the same reference numbers to omit redundant description.

In detail, as shown in FIG. 16, the comparator circuit of the eleventh embodiment comprises a signal converting circuit portion 50 constituted by two NMOS transistors Q51, Q52 for converting each voltage of input signals CS1, CS2 into current signals I51, I52, a switching circuit portion 60 constituted by two NMOS transistors Q61, Q62 for controlling transmission of the current signals to output terminals OUT1, OUT2 in accordance with a latch signal LB, a high level holding circuit portion 70 constituted by two PMOS transistors Q71, Q72 and two capacitors C71, C72 for maintaining each voltage level of the output terminals OUT1, OUT2 to a logical high-state only when a latch operation is not performed, an amplifying/determining circuit portion 80 having a positive feedback structure constituted by two PMOS transistors Q81, Q82 for amplifying the current signals and determining level of an objective signal, and an output level establishing circuit portion 130 constituted by four NMOS transistors Q131 to Q134 for enabling output signals of the output terminals OUT1, OUT2 to be equal to each potential of VDD or a ground VSS.

In the comparator circuit, the latch signal LB is commonly connected to gates of the transistors Q61, Q62 of the switching circuit portion 60. Also, in the output level establishing circuit portion 130, the transistor Q131 is connected between a gate of the transistor Q51 of the signal converting circuit portion 50 and an input terminal 51, and similarly the transistor Q132 is connected between a gate of the transistor Q52 and the other input terminal 52. When a latch operation is carried out, i.e. when the latch signal LB is a logical high level, the transistors Q61, Q62 are made conductive, the current signals I51, I52 converted by the converting circuit portion 50 are supplied through the transistors Q61, Q62 of the switching circuit portion 60 to the transistors Q81, Q82 of the amplifying/determining circuit portion 80.

In addition, when a latch operation is not carried out, i.e. when the latch signal LB is a logical low level, the output terminals OUT1, OUT2 all are maintained at a high level, i.e. the output terminals have so-called output holding state.

Therefore, the comparator circuit of FIG. 16 has the same effects as the circuit of the first embodiment (shown in FIG. 5).

Hereinafter, operation of the comparator circuit according to the eleventh embodiment will be described.

First, when the latch signal LB is a logical low level, i.e. at the stand-by state of the circuit, since all the transistors Q71, Q72 are made conductive and the transistors Q61, Q62 are not made conductive, each potential of the output terminals OUT1, OUT2 is a logical high level. Then, the transistors Q131, Q132 all are made conductive, and at the same time each potential of drains of the transistors Q51, Q52 becomes a logical low level.

Therefore, since the transistors Q133, Q134 are not made conductive, no current flows through the transistors Q51, Q52, even if the input signals CS1, CS2 are applied to the transistors Q51, Q52 through the transistors Q131, Q132, respectively. As a result, no current-consumption is produced.

Next, when the latch signal LB is changed from a low level to a high level, both of the transistors Q71, Q72 are made not conductive and then the transistors Q61, Q62 are made conductive. Then, each potential of the output terminals OUT1, OUT2 starts to be lowered. If a voltage level of the input comparison signal CS1 is higher than that of the input reference signal CS2, each potential of the output terminals OUT2 is further lowered in comparison to the output terminal OUT1, because the electric conductivity of the transistor Q51 is further lowered more than that of the transistor Q52.

Therefore, since the transistors Q81, Q82 are connected in a positive feedback structure, the potential of the output terminal OUT2 is equal to a ground VSS and the potential of the output terminal OUT1 is equal to the supply source VDD. Then, the transistors Q131, Q134 are made conductive and the transistors Q132, Q134 are not made conductive. The transistor Q51 is made conductive owing to applying the input comparison signal CS1 to a gate thereof, but no current flowing through the transistor Q81 is produced due to turning off of the transistor Q81.

In addition, the potential of the output terminal OUT1 is a high level owing to turning off of the transistor Q52, but no current flow is similarly produced.

As described above, since current-consumption is zero during the normal operation of the comparator circuit in the eleventh embodiment, the comparator circuit has a low power-consumption characteristic.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A low power-consumption type comparator circuit capable of operating in a latch state and a normal state, said circuit having two input terminals for receiving two input voltage signals, one of which is an input reference signal and the other of which is an input comparison signal, and two output terminals having respective voltage levels, the circuit comprising:

signal converting means for converting said voltage input signals into current signals;

switching/feedback means for controlling transmission of the current signals to the output terminals during performing a latch operation of the circuit and feeding back output signals of the output terminals thereto;

high level holding means for maintaining each voltage level of the output terminals to a logical high-state only when the latch operation is not performed;

amplifying/determining means for amplifying the current signals and determining logical level of the input comparison signal as one of the input signals;

output switching means for the controlling transmission of output signals to control terminals of the switching/feedback means; and low level holding means for maintaining each voltage level of the control terminals of the switching/feedback means to a logical low-state so as to enable the switching/feedback circuit portion not to be made conductive only when the latch operation is not performed.

2. The comparator circuit as defined in claim 1, wherein the output switching means is constituted by two transmission gates, each of which is composed of a PMOS-NMOS transistor pair in which drain and source are coupled to each other.

3. The comparator circuit as defined in claim 2, wherein two NMOS transistors of each of the transmission gates are provided to reduce each resistance of two PMOS transistors which are made conductive when all the output signals of the output terminals are low level.

4. The comparator circuit as defined in claim 1, wherein said signal converting means comprises two transistors arranged in a positive differential amplifier structure, one of which receives the input comparison signal through a gate thereof, and the other of which receives the input reference signal through a gate thereof.

5. A low power-consumption type comparator circuit capable of operating in a latch state and a normal state, said circuit having two input terminals for receiving two input voltage signals, one of which is an input reference signal and the other of which is an input comparison signal, and two output terminals having respective voltage levels, the circuit comprising:

first and second transistors connected in parallel with each other for receiving the input signals and converting the input voltage signals into current signals;

third and fourth transistors connected in parallel with each other for controlling transmission of the current signals to the output terminals during performing a latch operation of the circuit and feeding back output signals of the output terminals to gates thereof, respectively;

fifth and sixth transistors connected in parallel with each other for maintaining each voltage level of the output terminals to a logical high-state only when the latch operation is not performed;

seventh and eighth transistors connected in parallel with each other for amplifying the current signals and determining level of the input comparison signal;

ninth to twelfth transistors for the controlling transmission of output signals to gates of the third and fourth transistors; and thirteenth and fourteenth transistors connected in parallel with each other for maintaining each voltage level of the gates of the third and fourth transistors to a logical low level so as to enable the third and fourth transistors not to be made conductive only when the latch operation is not performed.

6. The comparator circuit as defined in claim 5, wherein the ninth to twelfth transistors constitute two transmission gates, each of which is composed of a PMOS-NMOS transistor pair in which drain and source are coupled to each other.

7. The comparator circuit as defined in claim 5, wherein two NMOS transistors of each of the transmission gates are provided to reduce each resistance of two PMOS transistors which are made conductive when all the output signals of the output terminals are low level.

8. A low power-consumption type comparator circuit capable of operating in a latch state and a normal state, said circuit having two input terminals for receiving two input voltage signals, one of which is an input reference signal and the other of which is an input comparison signal, and two output terminals having respective voltage levels, the circuit comprising:

first and second transistors connected in parallel with each other, for receiving the input signals and converting each voltage of input signals into current signals;

third and fourth transistors connected in parallel with each other for controlling transmission of the current signals to the output terminals in accordance with a latch signal;

fifth and sixth transistors connected in parallel with each other for maintaining each voltage level of the output terminals to a logical high level only when a latch operation is not performed;

seventh and eighth transistors connected in parallel with each other for amplifying the current signals and determining logical level of the input comparison signal; and ninth to twelfth transistors for enabling output signals of the output terminals to be equal to each potential of the input signals or a ground level.

* * * * *